United States Patent
Nunes Vicente Rebordao et al.

(10) Patent No.: US 7,319,551 B2
(45) Date of Patent: Jan. 15, 2008

(54) MASKLESS OPTICAL INTERFEROMETRIC LITHOGRAPHY

(75) Inventors: Jose Manuel Nunes Vicente Rebordao, Milharado (PT); Alexandre Pereira Cabral, Lisboa (PT)

(73) Assignee: Imprensa Nacional Casa Da, Lisbon (PT)

( * ) Notice: Subject to any disclaimer, the term of this patent is extended or adjusted under 35 U.S.C. 154(b) by 59 days.

(21) Appl. No.: 10/550,411

(22) PCT Filed: Mar. 25, 2003

(86) PCT No.: PCT/PT03/00004

§ 371 (c)(1),
(2), (4) Date: Sep. 23, 2005

(87) PCT Pub. No.: WO2004/058363

PCT Pub. Date: Oct. 14, 2004

(65) Prior Publication Data

US 2007/0002448 A1    Jan. 4, 2007

(51) Int. Cl.
*G03H 1/04* (2006.01)
(52) U.S. Cl. .................. 359/35; 430/1; 385/37
(58) Field of Classification Search ............ 359/35; 430/1, 2; 385/37
See application file for complete search history.

(56) References Cited

U.S. PATENT DOCUMENTS

| | | |
|---|---|---|
| 4,918,469 A | 4/1990 | McGrew |
| 5,032,003 A | 7/1991 | Antes |
| 5,138,471 A | 8/1992 | McGrew |
| 5,291,317 A | 3/1994 | Newswanger |
| 5,660,954 A | 8/1997 | Suga et al. |
| 6,043,913 A | 3/2000 | Lu et al. |
| 2001/0035991 A1* | 11/2001 | Hobbs et al. ............. 359/35 |
| 2001/0053608 A1 | 12/2001 | Williams et al. |
| 2002/0149751 A1* | 10/2002 | Bloomstein et al. ....... 353/122 |

FOREIGN PATENT DOCUMENTS

EP    534616    10/1997

(Continued)

OTHER PUBLICATIONS

Bass, Michael. Optical Society of America., "Handbook of Optics." McGraw Hill, Inc. 1995.

(Continued)

*Primary Examiner*—Leonidas Boutsikaris
(74) *Attorney, Agent, or Firm*—Pearl Cohen Zedek Latzer LLP

(57) ABSTRACT

An optical device generated by interferometric lithography, in the form of a surface relief pattern that diffracts light, to be used mainly in optical security, produced by optical systems compliant with the Schimpflug and hinge Rules containing: two identical lenses L1 and L2, two physical object location B1 e B2 and one image plane A1≡A2. No physical mask is needed throughout the origination process, thus eliminating any kind of border effects. The device actually implements an in-plane focused hologram, with a complex surface pattern of valleys and ridges with a non-trivial generating function, which is, by itself, both an additional security feature of the device and its fingerprint. The time to generate the optical device is proportional to the number of colours specified for the reference geometry and not depend on the overall area of the optical device.

5 Claims, 6 Drawing Sheets

FOREIGN PATENT DOCUMENTS

Figure 1:
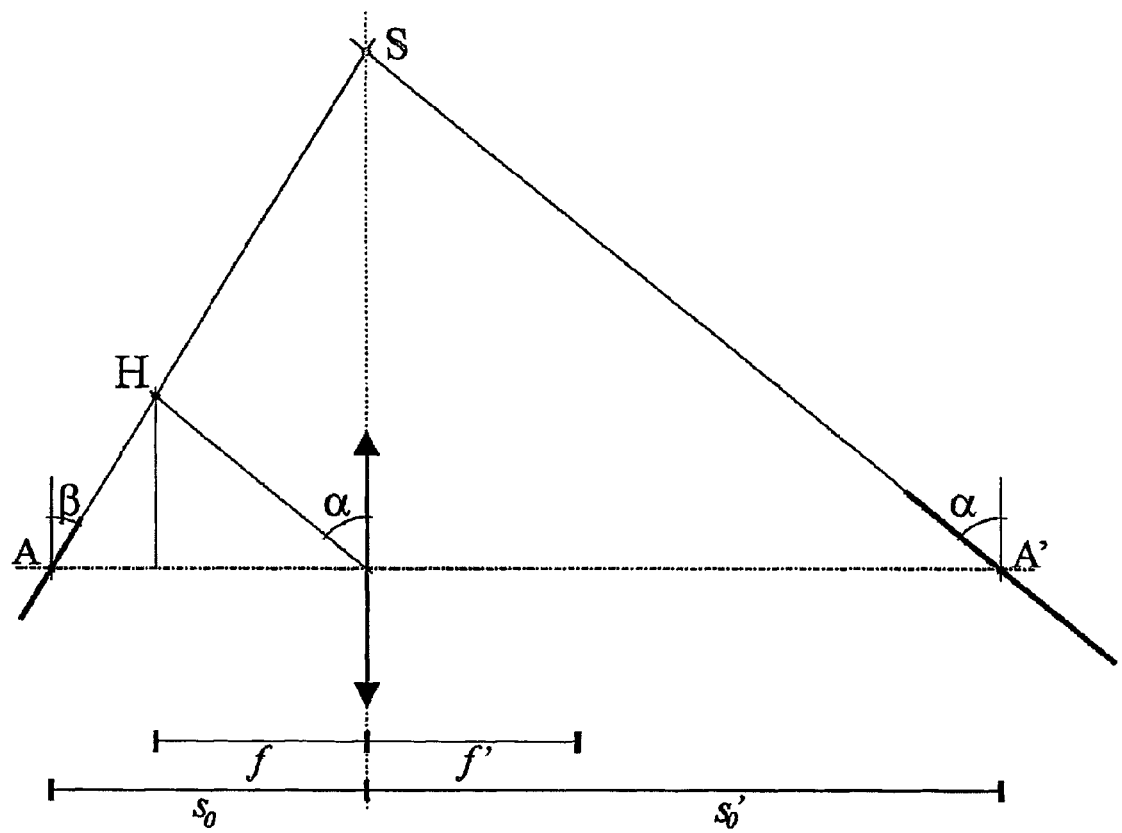

| | | |
|---|---|---|
| WO | WO 9523986 | 9/1995 |
| WO | WO 99/59035 | 11/1999 |
| WO | WO 00/26703 | 5/2000 |

OTHER PUBLICATIONS

Carpenter, Jules., Provisional Specification—"Improvements in Enlarging or Like Cameras." Jan. 17, 1901.

Collier, Robert J., et al. "Optical Holography." Academic Press. 1971.

"Desargues Theorem," Mathworld.wolfram.com. http://www.mathworld.wolfram.com/desarguestheorem.html. (printed on Mar. 6, 2006).

Hutley, M.C., "Diffraction Gratings," Academic Press, 1982.

Hecht, Eugene. "Optics," Addison Wesley. 1998.

Petit, R. "Electromagnetic Theory of Gratings," Springer-Verlag Berlin Heidelberg, NY 1980.

Scheimpflug, Theodor., Provisional Specification—"Improved Methods and Apparatus for the Systematic Alteration or Distortion of Plane Pictures and Images by Mcans of Lenses and Mirrors for Photography and for Other Purposes.", May 12, 1904.

Van Renesse, Rudolf L., Optical Document Security, "Iridescent Optically Variable Devices: A Survey," Chapter 15.

International Search Report—International Application No. PCT/PT 03/00004 Nov. 20, 2003.

* cited by examiner

MASKLESS OPTICAL INTERFEROMETRIC LITHOGRAPHY

The present application is a National Phase Application of PCT International Application PCT/PT2003/000004, entitled "Maskless Optical Interferometric Lithography" filed on Mar. 25, 2003, which is incorporated herein by reference in its entirety.

TECHNICAL DOMAIN OF THE INVENTION

This invention addresses the optical origination, through interferometric lithography, of optical elements endowed with optimum characteristics to securely protect products and documents against forgery and counterfeiting.

BACKGROUND OF THE INVENTION

Interferometric lithography is one of the most flexible tools to generate microstructures that, by diffraction, produce polychromatic beams with spectral and angular properties of importance for optical security devices [11].

The way such microstructure diffracts light depends, on the one hand, on the shape, dimension and position of the light sources and, on the other hand, on the shape and dimensions of the spatial domain where interference takes place [12 and 13].

Many implementations of interferometric lithography have been described. The most important are:

point light sources producing spherical divergent waves, or plane waves obtained after collimation, the position and orientation of which can be controlled, the interference pattern being confined to the interior of a mask placed as close as possible to the plane of the photosensitive emulsion, typically of photographic nature;

two spherical waves interfering on their common focal volumes, said waves being formatted and shaped by two or more lenses properly located and adequately phased.

In the first case, a non-pixelated pattern is created. This type of implementation can be found in patents [3 to 6]. In the second case, the interference is restricted to dots of controlled shape, the pixels, usually arranged in random, polar or rectangular format. This type of implementation can be found in patents [7 to 10]. In the pixelated case, there is an inefficient utilisation of the photosensitive area, as the quality of the interference pattern—consequently the micro-relief that is generated after chemical or thermal processing—strongly depends on the Gaussian character of the laser beam. It is possible to overcome this problem by masking the Gaussian beam, using only the central part of it, but, in this case, the amount of available energy to expose the emulsion is reduced, leading to longer exposures. Visually, unless the density of dots is very high, the pixelated character is always visible, even if it does not jeopardise the quality and the security of the device. The larger the density of pixels, the longer will be the time needed to complete the exposure of all pixels that build up the desired shape. Manufacturing time is thus proportional to the total number of pixels.

In both cases, the interference pattern is very simple, basically consisting of quadratic fringes that can be approximated in most of the cases by linear and parallel fringes. Diffraction by linear phase gratings is well known, and the optical effects that can be obtained are limited [12].

In-plane holography (or focused holography) is a technique to encode images holographically, by creating an in-focus real image (object beam) on the photosensitive plane and introducing a reference beam—typically plane or spherical—thus generating an interference pattern within the area covered by the object beam [14]. On reconstruction, the spectral and angular properties of the diffractive beam are of interest. The problem with focused holography is that if the area of interest is to be covered by a several patterns, say N, each point receives energy from the reference beam N times, which severely degrades the modulation of the microstructure and reduces the diffraction efficiency, thus actually destroying it as a security device. If, somehow, the reference beam could be restricted to the exact area of the object beam, this problem would be overcome. One way to solve the problem is to place a mask with the desired shape in the image plane, as close as possible to the emulsion to avoid diffraction problems. The problem with this technique is that all the masks for the different patterns must be precisely aligned and separated from the emulsion with a thin layer of an optical liquid (to match the refractive index), making it very difficult (or even impossible) to use when a large number of masks is required. The total amount of time needed to complete the creation of the optical element is, in this case, proportional to the number of patterns (i.e. masks) needed to define the element image

INVENTION EXPLANATION

This invention shows how implement optical systems that ensure focused holography for an arbitrary number of polygons that fully cover the final desired image (composed of several patterns), using interference beams making an adequate angle, without the need of physical masks located near the image plane, while ensuring a processing time proportional to the number of colours specified for the reference geometry.

One embodiment includes a maskless optical setup to generate interference patterns within selected areas of a photosensitive material, without the need of any physical mask to delimit or delimitate the spatial extent of the register of the interference pattern, ensuring that the surrounding area is not affected by light. The device may ensure that the time needed to register all the design polygonal patterns (that build up the complete optical device) is linearly proportional to the number of colors specified for the reference geometry and not to the area or to the number of pixels within the overall area of the optical device. The device may be based on the Scheimpflug and Hinge conditions, ensuring adequate superposition between different optical beams in an imaging configuration. The device optical configuration may be based on two object physical locations and two optical channels. The device optical configuration may be based on one object physical location and two optical channels. The device optical configuration may be based on one object physical location and one optical channel.

The invention is based on a well known principle of photography to determine how a viewing camera focuses when both the object and the image plane are tilted with respect to the optical axis of the lens: the Schempflug Rule [1, 2 and 15]. This rule, which is a necessary condition for focusing—meaning that there are many ways to adjust the camera satisfying the rule but not ensuring focusing—needs to be complemented by a second necessary condition, the Hinge Rule: when both rules are satisfied, the camera will be in focus [2]. As it is well known, diffraction effects are minimised when the image is precisely focused.

The Schimpflug Rule is based on Desargues theorem [16] and states that the object plane, the image plane and the "lens plane" should intersect on a common line. The Hinge Rule is similar, stating that the object plane, the plane through the "centre" of the lens and parallel to the image plane and the object focal plane should intersect along a common line.

Mathematically, it is possible to obtain from FIG. 1 the following equations, the first representing the Schimpflug Rule and the second the Hinge Rule:

$$\frac{\tan(\alpha)}{\tan(\beta)} = \frac{s'_0}{s_0} \qquad \frac{\tan(\alpha)}{\tan(\beta)} = \frac{f}{s_0 - f}$$

$\beta$ and $\alpha$ are the tilting angles of the object and image planes with respect to the normal to the optical axis of the corresponding lens subsystem, $s_0$ and $s'_0$ are the object and image distances, respectively, and the focal length of the lens.

If the two equations are combined, the lens equation [17] is obtained, showing that when both rules are satisfied, the camera is focused.

Figure 2:
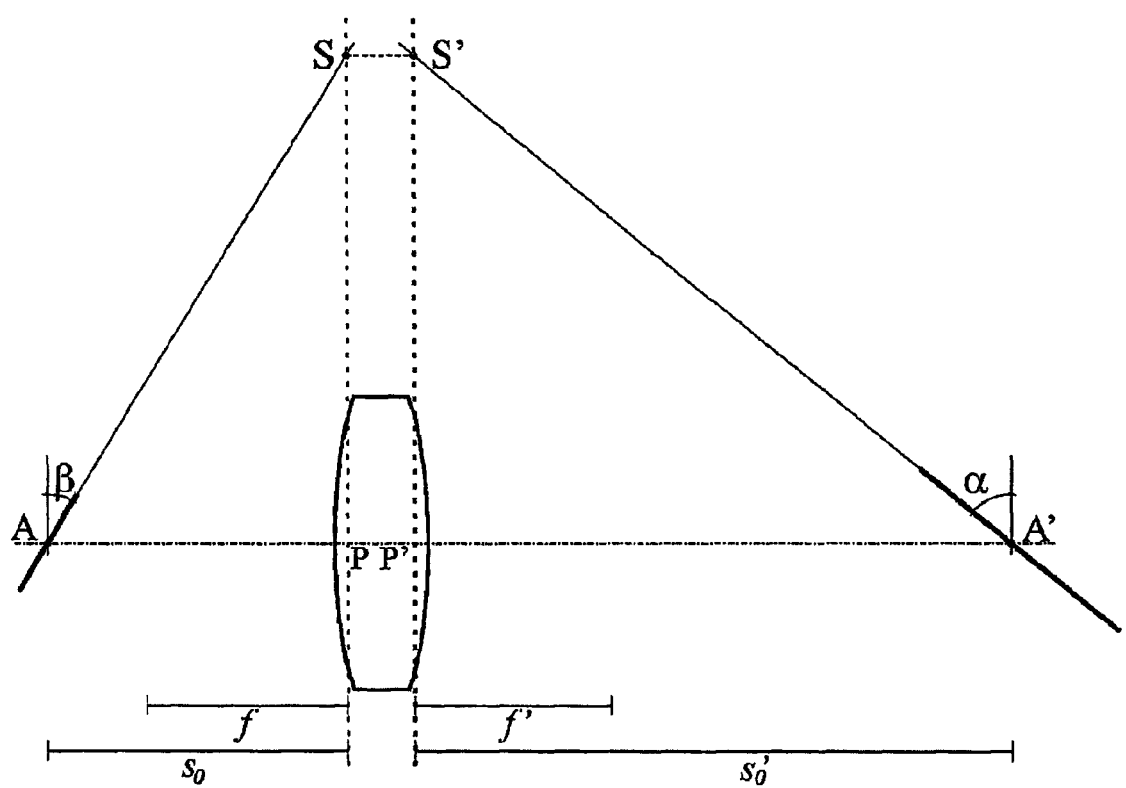
Figure 3:
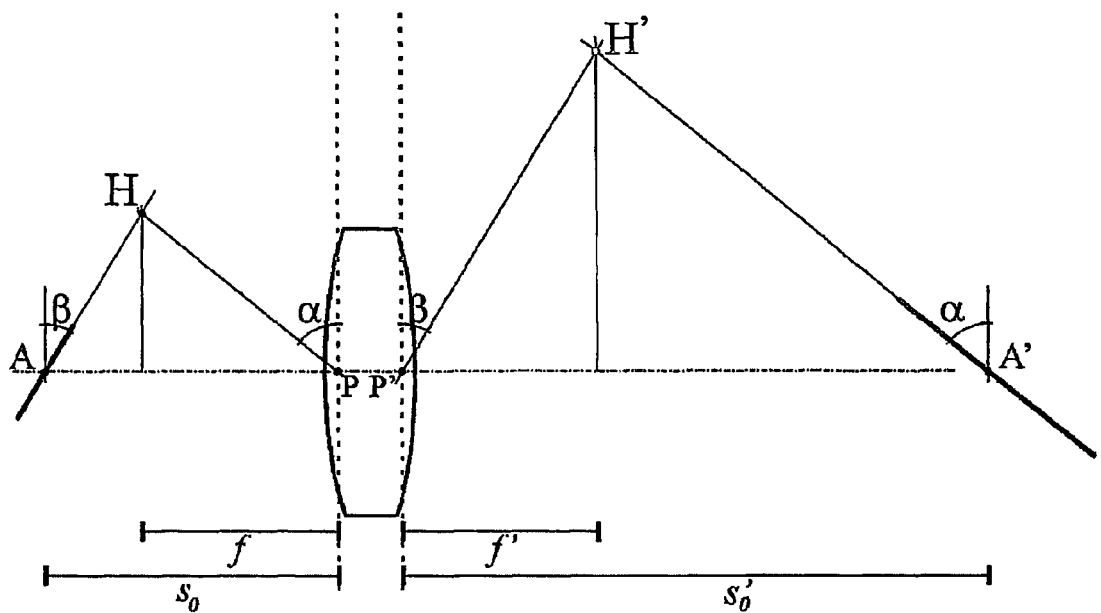

These simple rules must be slightly modified for thick lenses with non-superposed object and image principal planes. It can be easily demonstrated, using the lens equation, that:

tilted object and image conjugated planes intersect the object and image principal planes at the same distance from the optical axis, thus effectively splitting the Scheimpflug line into two parallel lines, one in each principal plane (FIG. 2).

the tilted object plane, the object focal plane and the plane parallel to the image plane through the object principal point all intersect on the object Hinge line; in addition, the tilted image plane, the image focal plane and the plane parallel to the object plane through the image principal point intersect on the image Hinge line; both Hinge lines are parallel; they will be at the same distance from the optical axis when the axial magnification is $m_0=-s'_0/s_0=-1$ (FIG. 3).

In a tilted image plane configuration, the magnification is not uniform across the field. For example, in order to get similar image and object dimensions, the axial magnification should be set to m=−1 by ensuring that both axial object and image distances are set to 2f, f being the focal length. When the image and object planes are tilted, as we move away from the optical axis, the magnification changes because the object point and image point distances vary.

The known non-uniform magnification can be compensated by a pre-distortion of the object input, at the object plane. This compensation can be made digitally. It can be shown that the magnification between tilted conjugated planes is described by (FIG. 4):

$$m(x', \alpha) = m_0 + \frac{x' \cdot \sin(\alpha)}{f}$$

$m_0$ is the axial magnification, x' is the in-plane distance from the optical axis, f the focal length and the tilting angle of the image plane with respect to the normal to the optical axis of the corresponding lens subsystem. For every position in the horizontal axis of the image plane, the magnification will be the same in the vertical line that crosses it.

It should be noted that centrally symmetric conjugates are not necessary, although such a configuration minimises distortion. It may be interesting or necessary to change the dimension of the image with respect to the object, and distances should be established according to the paraxial equations of geometric optics.

Figure 5:
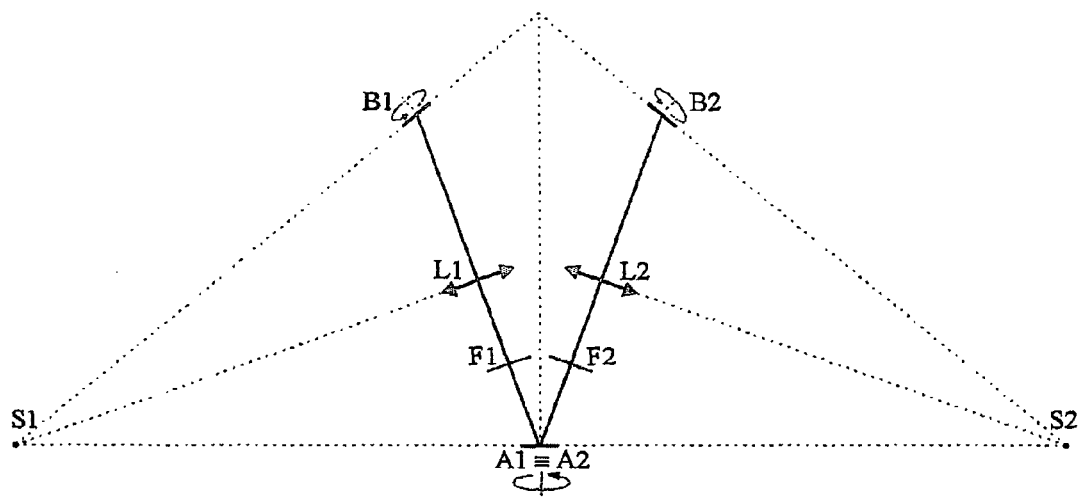

FIG. 5 illustrates for thin lenses one possibility to actually implement focused holography with equal format object and reference beams; changes should be obvious for thick lenses. Two optical channels satisfying the Scheimpflug and the Hinge Rules are composed of two tilted object physical locations B1 and B2 and two identical lenses L1 and L2 that create real superimposed images on the final common tilted image plane (A1 and A2). The two objects must have the correct orientation and pre-distortion to correct the non-uniform magnification in order to correctly superimpose the two images. The points S1 and S2 represent the intersection points complying with the Scheimpflug Rule.

The optical beams propagating along the two optical channels interfere and the interference pattern is recorded in a photosensitive material placed in the image plane (A1≡A2). From an optical point of view, it should be stressed that the local interference angle changes from point to point, that complex image waves (not just simple spherical waves) are interfering and that the interference pattern is much more complex than a simple linear pattern.

The mean grating period of the interference pattern depends on the mean angle between the two optical channels. By controlling such mean angle, it is possible to control the geometry of observation and the way the different wavelengths (colours) change when that geometry changes. It is also possible to define a reference geometry (with a particular illuminant, an angle of illumination and an angle of observation) and, for that particular geometry, colours corresponding to grating periods and orientations. The object is composed of an envelope of 2D polygons, each one with its own colour for the reference geometry. Nevertheless, the overall number of colours is always much smaller than the number of polygons. The different colours of all the 2D polygons result from different grating orientations. To obtain different grating orientations, the objects and the photosensitive material in the image plane should be rotated around the normal to the image plane.

The object can be on display on any kind of device that encodes the desired object distribution. As stated before, with photographic masks there is the problem of aligning every new mask. This problem is overcome if the object is displayed on a Spatial Light Modulator (SLM) that needs to be aligned only once, allowing all the exposures to take place in fast sequence. The system must use laser light and the way the beam is introduced into the system depends on the nature of the display (reflective or transmissive).

In the image focal plane of each optical channel (F1 and F2), perpendicular to the optical axis of the corresponding lens, a Fourier plane is available for optical filtering, thus allowing the control of the object spatial frequencies by phase or amplitude filtering.

The finest detail of the final image depends only on the object finest detail and the optical setup magnification.

Figure 6:
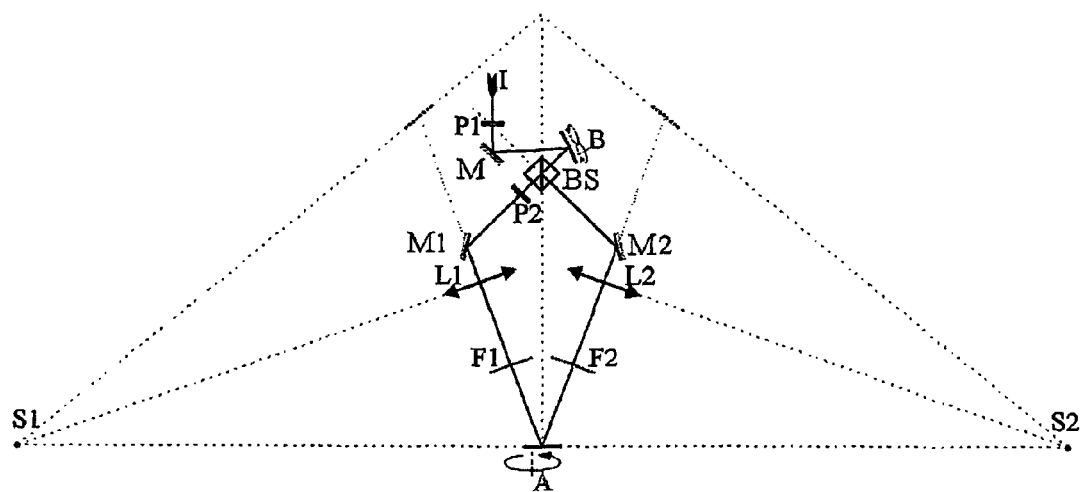

In a second configuration, only one physical object location has to be selected and two images of it are created. The system is more compact, easy to align and easy to control. FIG. 6 describes the changes, using a reflective SLM to display the object, and the corresponding setup.

A filtered collimated laser beam (I) enters the system. After reflection on the plane mirror (M), the beam is redirected to the reflective SLM (B), where the object distribution is encoded, thus modulating the amplitude of the beam (I). The modulated beam is then split by beam splitter (BS) into two perpendicular beams. A critical alignment is required to ensure that the diagonal of the BS is within the symmetry plane of the overall optical setup. Mirrors M1 and M2 redirect light to the lens, creating two different virtual images of the object, in the same object positions as described in FIG. 5.

As it is not possible to the change spatial orientation of one optical channel without changing the other for the same tilt angle, the image given by one channel will be symmetrical with respect to the other. If the object has horizontal symmetry the overlapping is perfect (FIG. 7a). For non-symmetric objects, it is necessary to compensate the lack of symmetry (FIG. 7b), for example, by creating a new symmetric object that results from joining the desired object with is symmetric image (FIG. 7c). We thus overcome the problem with the cost of reducing the size of the original object by 50% (region of interest in FIG. 7c).

The optical beams propagating along the two optical channels interfere and the interference pattern is recorded in a photosensitive material placed in a controlled rotational stage in the image plane (A). The centre of rotation should be the centre of the image for symmetric objects or the centre of one of the two images for non-symmetric ones. The convenient spatial frequency filtering masks are located in the Fourier planes (F1 and F2).

To control the relative intensity between the final interfering beams, it is possible to add neutral density filters. A most adequate way is to use polarised laser light and split the beam according to the polarisation, thus using all the available energy. In FIG. 5 a filtered, polarised and collimated laser beam (I) enters the system, the halfwave plate P1 adjusts the plane of polarisation, and the polarising beam splitter (BS) splits the modulated beam into two perpendicular beams, with relative intensities determined by P1. In one of the optical channels (left channel in FIG. 6) a 45° oriented half-wave plate (P2) restores the common polarisation plane for both beams.

Figure 8:
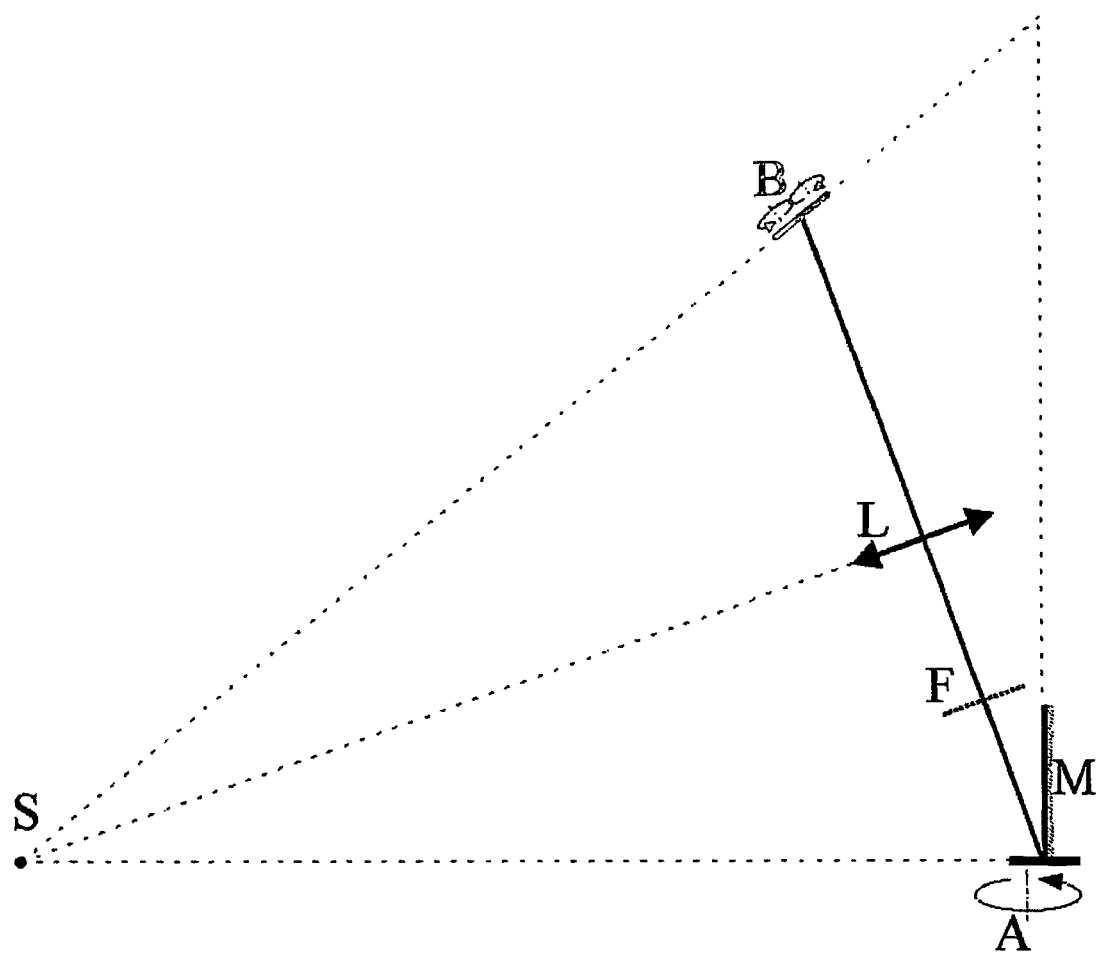

It is also possible to implement this invention using only one physical channel. FIG. 8 describes the configuration. The second optical channel is the virtual image of the real one given by the mirror M. There is no control of the relative intensities and the mirror M must be very close to the rotational stage that contains the photosensitive material placed in the image plane (A).

DRAWING DESCRIPTION

FIG. 1—Positive thin lens with focal lengths f and f' (object and image), an object plane A and image plane A' making, respectively, β and α degrees with the perpendicular to the optical axis. The distances $s_0$ and $s_0'$ are the axial object and image distances. The points S and H are, respectively, the points where the Scheimpflug line and the Hinge line intercept the plane of the drawing.

FIG. 2—Same as FIG. 1 with the thin lens replaced by a thick lens with its principal planes (dashed lines) and principal points P and P'. The points S and S' are the two points where the Scheimpflug lines (image and object) intercept the plane of the drawing.

FIG. 3—Same as FIG. 2. The points H and H' are the two points where the Hinge lines (image and object) intercepts the plane of the drawing.

Figure 4:
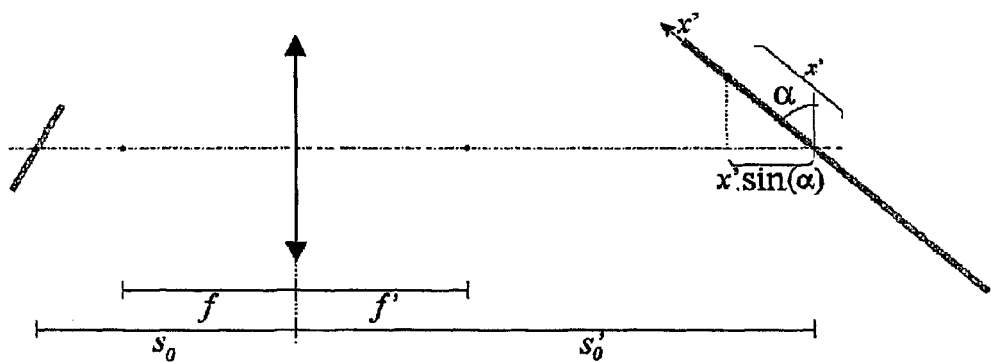

FIG. 4—Variation of the magnification in the image plane as a function of the distance to the optical axis and the tilting angle. x' is the distance to the optical axis in the image plane, and is the image plane inclination angle with respect to the optical axis normal.

FIG. 5—Implementation based on two optical channels satisfying the Scheimpflug and the Hinge Rules with object physical locations B1 and B2, two identical lenses L1 and L2, an image plane A1≡A2, two Fourier planes for spatial filtering F1 and F2 and the two Scheimpflug Rule intersection points S1 and S2.

FIG. 6—Implementation based on two optical channels satisfying the Scheimpflug and the Hinge Rules, with one object physical location B, a filtered and collimated polarised laser beam I, a polarising beam splitter BS, two half-wave plates P1 and P2, three mirrors M, M1 and M2, two identical lenses L1 and L2, an image plane A, two Fourier planes for spatial filtering F1 and F2, and the two Scheimpflug Rule intersection points S1 and S2.

Figure 7:
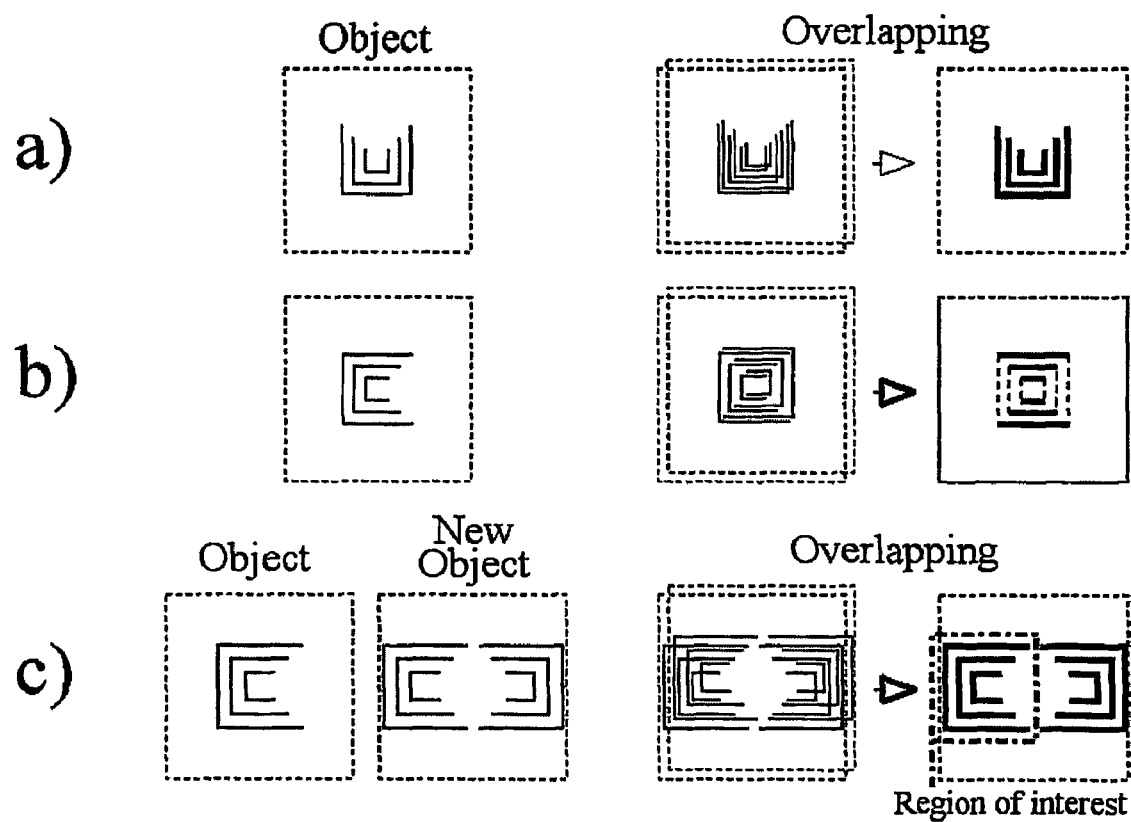

FIG. 7—a) Overlapping of the images given by the two optical channels for a symmetric object; b) Overlapping of the images given by the two optical channels for a non-symmetric object; c) Compensation of the non-symmetry with the creation of a new symmetric object.

FIG. 8—implementation based on one optical channel satisfying the Scheimpflug and the Hinge Rules with one object physical location B, a lens L, an image plane A, a Fourier planes for spatial filtering F, a mirror M and the Scheimpflug Rule intersection point S.

REFERENCES TO PATENTS

[1]—J. Carpentier, "Improvements in Enlarging or like Cameras", British Patent no. 1139(1901)
[2]—T. Scheimpflug, "Improved Method and Apparatus for Systematic Alteration or Distortion of Plane Pictures and Images by Means of Lenses and Mirrors for Photography and for other purposes", British Patent no. 1196 (1904)
[3]—H. Souparis, "Method for the production of an optically variable image", World Patent (WO) no. 2986 (1995)
[4]—Suga et al, "Hologram and method of and apparatus for producing the same", U.S. Pat. No. 5,660,954 (1997)
[5]—Hasegawa et al, "Holographic recording appts. e.g. for laser beam printers", European Patent (EP) no. 534616 (1998)
[6]—S. McGrew, "Diffractive color and texture effects for the graphic arts", U.S. Pat. No. 4,918,469 (2000).
[7]—G. Antes, "Optically variable surface pattern", U.S. Pat. No. 5,032,003 (1991)
[8]—S. McGrew, "Holocomposer", U.S. Pat. No. 5,138,471 (1992)
[9]—C. Newswanger, "Holographic diffraction grating patterns and methods for creating the same", U.S. Pat. No. 5,291,317 (1994).
[10]—Lu et al, "Apparatus for Producing Dot Matrix Hologram", U.S. Pat. No. 6,043,913 (2000)

REFERENCES TO OTHER DOCUMENTS

[11]—R. L. van Renesse, "Optical Document Security", 2nd edition, Artech House (1998)
[12]—R. Petit, "Electromagnetic Theory of Gratings", Springer-Verlag (1980)
[13]—M. C. Hutley, "Diffraction Gratings", Academic Press (1982)
[14]—R. J. Collier, "Optical Holography", Academic Press (1971)
[15]—M. Bass, "Handbook of Optics", 2nd edition, McGraw-Hill (1995)
[16]—E. W. Weisstein, "The CRC Concise Encyclopedia of Mathematics", CRC Press (1998)
[17]—E. Hecht, "Optics", 4th edition, Addison-Wesley (2002)

The invention claimed is:

1. A maskless optical device based on interferometric lithography to generate an interference pattern within selected areas of a photosensitive material ensuring that the surrounding area is not affected by light, producing diffractive optical variable image devices for security, comprising:
   a first optical channel and a second optical channel at an angle for interfering with the photosensitive material; the first optical channel comprising a first imaging lens for producing an image from a first object at an image plane; the second optical channel comprising a second imaging lens for producing an image from a second object at the image plane, and wherein the device complies with the Scheimpflug rule and the Hinge rule; wherein the interference pattern comprises the images of the first and second objects;
   wherein the time needed to register a complete polygonal pattern is linearly proportional to the number of interference patterns specified for the reference geometry and not to the overall area of the optical device.

2. The maskless optical device of claim 1 comprising an optical configuration selected from the group consisting of: two physical objects and two physical optical channels; one physical and one virtual object and two physical optical channels; and one physical and one virtual object and one physical and one virtual optical channel.

3. The maskless optical device of claim 1 wherein the photosensitive material is rotated to materialize diffractive patterns with different grating orientation.

4. The maskless optical device of claim 1 wherein the angle between the optical channels is controllable to materialize diffractive patterns with different grating orientation.

5. The maskless optical device of claim 1 in which the object is displayed by an amplitude spatial light modulator.

* * * * *